US007201407B2

(12) United States Patent
Schlack

(10) Patent No.: US 7,201,407 B2
(45) Date of Patent: Apr. 10, 2007

(54) SLIDING PANEL LATCH

(75) Inventor: Richard E. Schlack, Rising Sun, MD (US)

(73) Assignee: Southco, Inc., Concordville, PA (US)

(*) Notice: Subject to any disclaimer, the term of this patent is extended or adjusted under 35 U.S.C. 154(b) by 0 days.

(21) Appl. No.: 10/875,965

(22) Filed: Jun. 24, 2004

(65) Prior Publication Data

US 2005/0023838 A1 Feb. 3, 2005

Related U.S. Application Data

(60) Provisional application No. 60/482,830, filed on Jun. 25, 2003.

(51) Int. Cl.
*E05C 1/00* (2006.01)
*H05K 5/00* (2006.01)

(52) U.S. Cl. ........................ 292/139; 292/36; 292/150; 292/207; 292/247; 292/302; 292/336.3; 292/DIG. 11; 292/DIG. 31; 312/223.1; 361/679; 361/683

(58) Field of Classification Search ................ 292/139, 292/36, 150, 158, 207, 246, 247, 295, 302, 292/336.3, DIG. 11, DIG. 31, DIG. 68, DIG. 30, 292/113, 173; 312/223.1; 361/679, 683
See application file for complete search history.

(56) References Cited

U.S. PATENT DOCUMENTS 1,915,492 A * 6/1933 Hennicke ..................... 292/66
2,710,214 A * 6/1955 Summers .................... 292/247
2,830,843 A * 4/1958 Seaburg et al. ............... 49/449
3,012,805 A * 12/1961 Poe ............................ 292/229
3,039,837 A * 6/1962 Poe ......................... 312/332.1
3,046,043 A * 7/1962 Matteson .................... 292/175
3,367,698 A * 2/1968 Walker, Sr. ................. 292/188
3,534,992 A * 10/1970 Swanson .................... 292/113
3,792,551 A 2/1974 Hallas (Continued)

FOREIGN PATENT DOCUMENTS

EP 0 106 065 A1 4/1984

(Continued)

OTHER PUBLICATIONS

Photographs of a Sliding Panel Latch used on an IBM Rack-Mountable Server attached as exhibits A through O.

*Primary Examiner*—Brian E. Glessner
*Assistant Examiner*—Carlos Lugo
(74) *Attorney, Agent, or Firm*—Paul & Paul

(57) ABSTRACT

A latch includes a cup adapted for mounting to a first member, snap legs for securing the cup to a first member, and a lever supported by the cup. The lever pivots about a pivot axis that is linearly movable relative to the cup. The lever includes a crossbar that is capable of engaging a keeper that is fixed relative to a second member. The crossbar is confined by the cup to move in a substantially straight linear direction that is perpendicular to the direction of motion of the pivot axis of the lever relative to the cup as the lever is moved pivotally about its pivot axis. The first member moves in a straight linear motion toward its secured position as the lever is moved to its closed position while the crossbar is in engagement with the stationary keeper.

7 Claims, 11 Drawing Sheets

U.S. PATENT DOCUMENTS

| | | | | | |
|---|---|---|---|---|---|
| 3,837,690 | A | | 9/1974 | Fraser, Jr. et al. | |
| 3,908,925 | A | | 9/1975 | Rinkleib et al. | |
| 3,958,821 | A | * | 5/1976 | Scalera | 292/97 |
| 4,131,933 | A | | 12/1978 | Agard et al. | |
| 4,184,705 | A | * | 1/1980 | Little | 292/247 |
| 4,307,906 | A | * | 12/1981 | Schenk | 292/247 |
| 4,428,608 | A | * | 1/1984 | Cooke et al. | 292/247 |
| 4,451,190 | A | | 5/1984 | Bellamy, Jr. et al. | |
| 4,554,807 | A | * | 11/1985 | Dolejs | 70/208 |
| 4,616,944 | A | | 10/1986 | Galatha et al. | |
| 4,706,577 | A | | 11/1987 | Jones | |
| 4,875,726 | A | * | 10/1989 | Thau | 292/337 |
| 4,945,435 | A | | 7/1990 | Boigenzahn et al. | |
| 4,949,651 | A | | 8/1990 | Frank et al. | |
| 4,991,818 | A | * | 2/1991 | Darbo et al. | 248/681 |
| 5,043,834 | A | | 8/1991 | Kubo et al. | |
| 5,052,730 | A | | 10/1991 | Frank et al. | |
| 5,062,671 | A | | 11/1991 | Goetz et al. | |
| 5,201,557 | A | * | 4/1993 | Schlack | 292/161 |
| 5,398,164 | A | | 3/1995 | Goodman et al. | |
| 5,444,690 | A | | 8/1995 | Childers, III et al. | |
| 5,465,191 | A | | 11/1995 | Normura et al. | |
| 5,526,226 | A | | 6/1996 | Katoh et al. | |
| 5,535,100 | A | | 7/1996 | Lubahn et al. | |
| 5,649,750 | A | | 7/1997 | Ishii et al. | |
| 5,794,994 | A | * | 8/1998 | Miyagawa et al. | 292/336.3 |
| 5,870,283 | A | | 2/1999 | Maeda et al. | |
| 5,982,627 | A | | 11/1999 | Haughton et al. | |
| 6,000,768 | A | | 12/1999 | Dials et al. | |
| 6,058,579 | A | | 5/2000 | Brocklesby et al. | |
| 6,141,209 | A | | 10/2000 | Kerrigan et al. | |
| 6,146,179 | A | | 11/2000 | Denny et al. | |
| 6,163,440 | A | | 12/2000 | Takahashi et al. | |
| 6,227,630 | B1 | | 5/2001 | Brown et al. | |
| 6,256,204 | B1 | | 7/2001 | Wormsbecher et al. | |
| 6,267,614 | B1 | | 7/2001 | Good et al. | |
| 6,345,429 | B1 | | 2/2002 | Jalanti et al. | |
| 6,354,638 | B1 | | 3/2002 | Hoffmann | |
| 6,362,975 | B1 | * | 3/2002 | Liu et al. | 361/796 |
| 6,409,234 | B1 | * | 6/2002 | Larsen et al. | 292/173 |
| 6,616,201 | B1 | * | 9/2003 | Liang | 292/207 |
| 6,637,785 | B2 | * | 10/2003 | Sugimoto | 292/336.3 |
| 6,824,174 | B2 | * | 11/2004 | Lin et al. | 292/85 |
| 6,918,274 | B2 | * | 7/2005 | Gladden et al. | 70/208 |
| 6,929,338 | B2 | * | 8/2005 | Chang | 312/223.2 |
| 6,957,979 | B2 | * | 10/2005 | Welsh et al. | 439/565 |
| 2004/0021325 | A1 | | 2/2004 | Schlack et al. | |

FOREIGN PATENT DOCUMENTS

| | | | |
|---|---|---|---|
| EP | 0 126 908 | A1 | 12/1984 |
| EP | 0 242 596 | A2 | 10/1987 |
| EP | 0 315 735 | A1 | 5/1989 |
| EP | 0 385 696 | A1 | 9/1990 |
| EP | 0 593 242 | A2 | 4/1994 |
| EP | 0 613 336 | A1 | 8/1994 |
| EP | 0 635 776 | A1 | 1/1995 |

* cited by examiner 108
110
122
136

108
122
136

136

122
108
136

122
136

136
122

136
144

136

136
146
144
146

136

SLIDING PANEL LATCH

CROSS REFERENCE TO RELATED APPLICATIONS

This application claims the benefit of the priority of U.S. Provisional Application for Patent No. 60/482,830, filed Jun. 25, 2003, the entire disclosure of which is incorporated herein by reference.

BACKGROUND OF THE INVENTION

1. Field of the Invention

The present invention relates to a latch for releasably securing a first member relative to a second member, wherein the first member moves at least in part slidably relative to the second member in order to move into the secured position.

2. Description of the Prior Art

Latches are used to releasably secure panels, covers, doors, electronic modules, and the like to other structures such as compartments, containers, door frames, other panels, frames, racks, etc. Although many types of latches are known in the art, none offers the advantages of the present invention. The advantages of the present invention will be apparent from the attached description and drawings.

SUMMARY OF THE INVENTION

The present invention is directed to a latch for use with members that move at least in part slidably into a secured position. The latch includes a cup adapted for mounting to a member such as a panel, door, cover, circuit board, or the like; means for securing the cup to the panel, door, cover, circuit board, or the like; a lever supported by the cup; and an optional EMC shield for shielding out stray electromagnetic fields or radiation when the latch is applied to enclosures for sensitive electronic equipment. The lever is supported by the cup in such a way that the lever can pivot about a pivot axis that is linearly movable relative to the cup. The lever includes a crossbar that is engageable with a keeper that is fixed relative to a supporting structure for the panel, for example, a compartment for which the panel acts as a closure member. The crossbar is confined by the cup to move in a substantially straight linear direction that is perpendicular to the direction of motion of the pivot axis of the lever relative to the cup as the lever is moved pivotally about its pivot axis. The member, such as a panel, door, cover, circuit board, or the like, to which the latch is mounted moves toward a secured position as the lever is moved to its closed position while the crossbar is in engagement with the stationary keeper.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figures 1A, 1B, 1C, 1D, 1E, 1F:
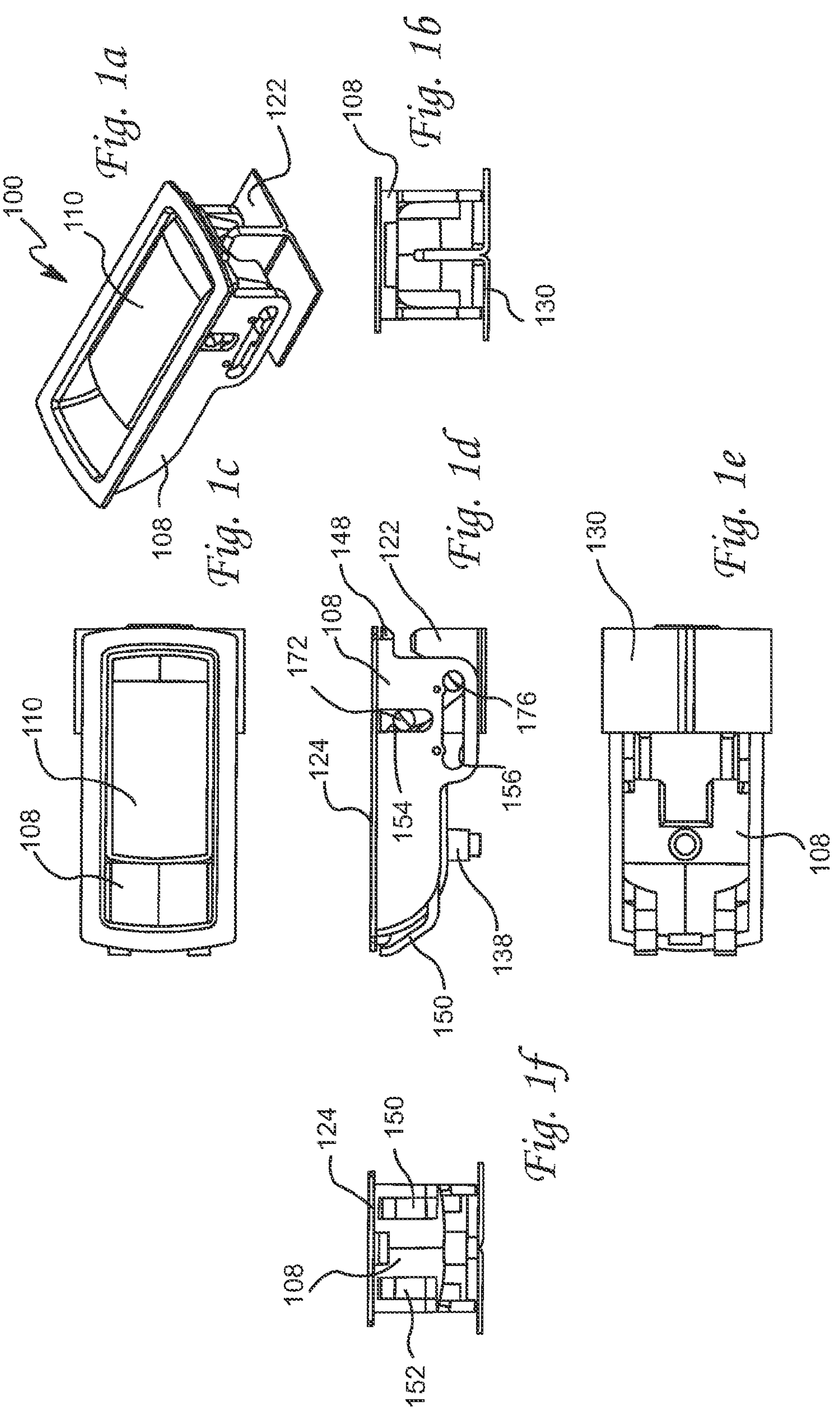
FIGS. 1*a*–1*f* are views of the sliding panel latch of the present invention, shown in the closed configuration.
Figures 2A, 2B, 2C, 2D, 2E, 2F:
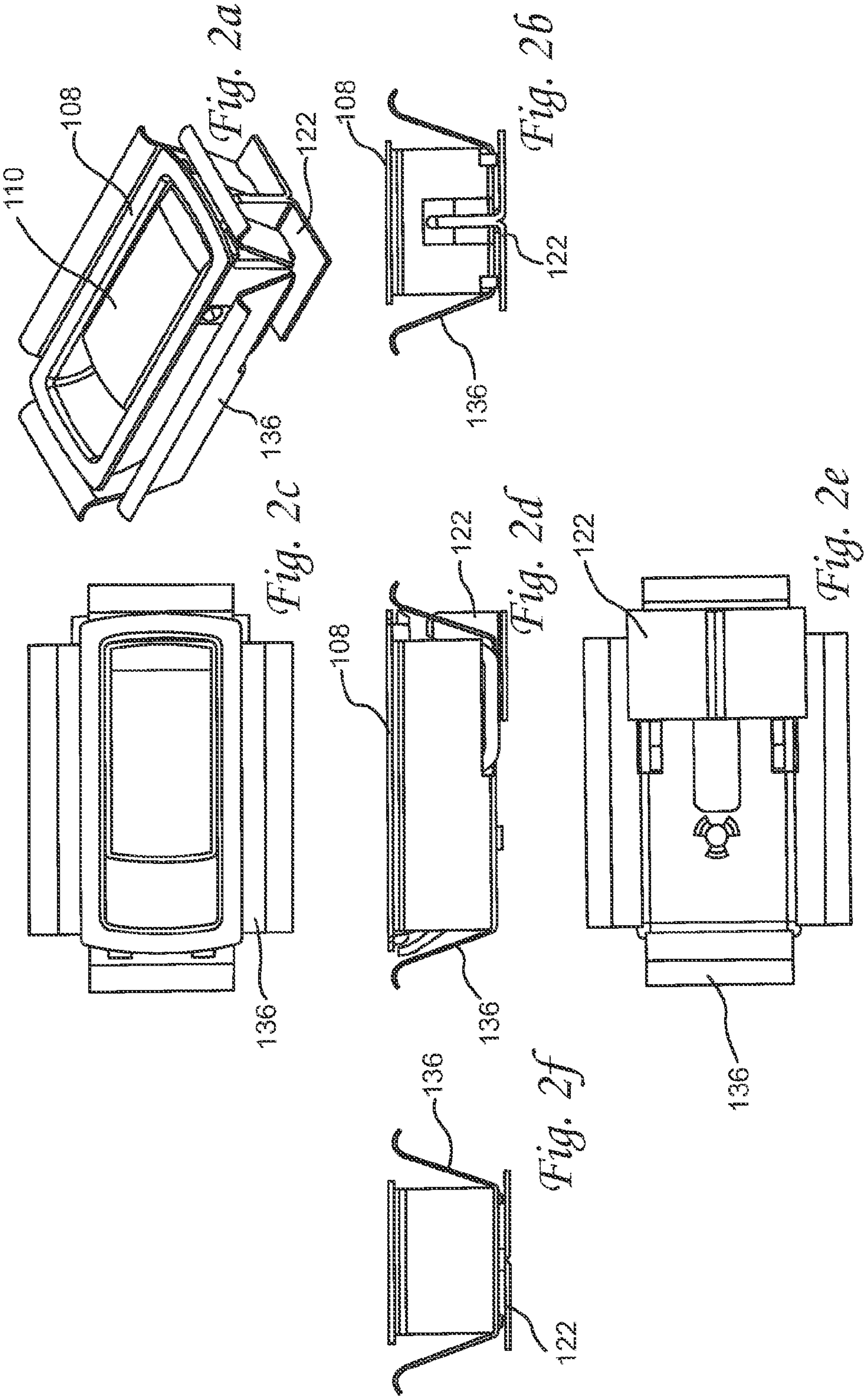
FIGS. 2*a*–2*f* are views of the sliding panel latch of the present invention, shown in the closed configuration with the EMC shield installed.
Figures 3A, 3B, 3C, 3D, 3E:
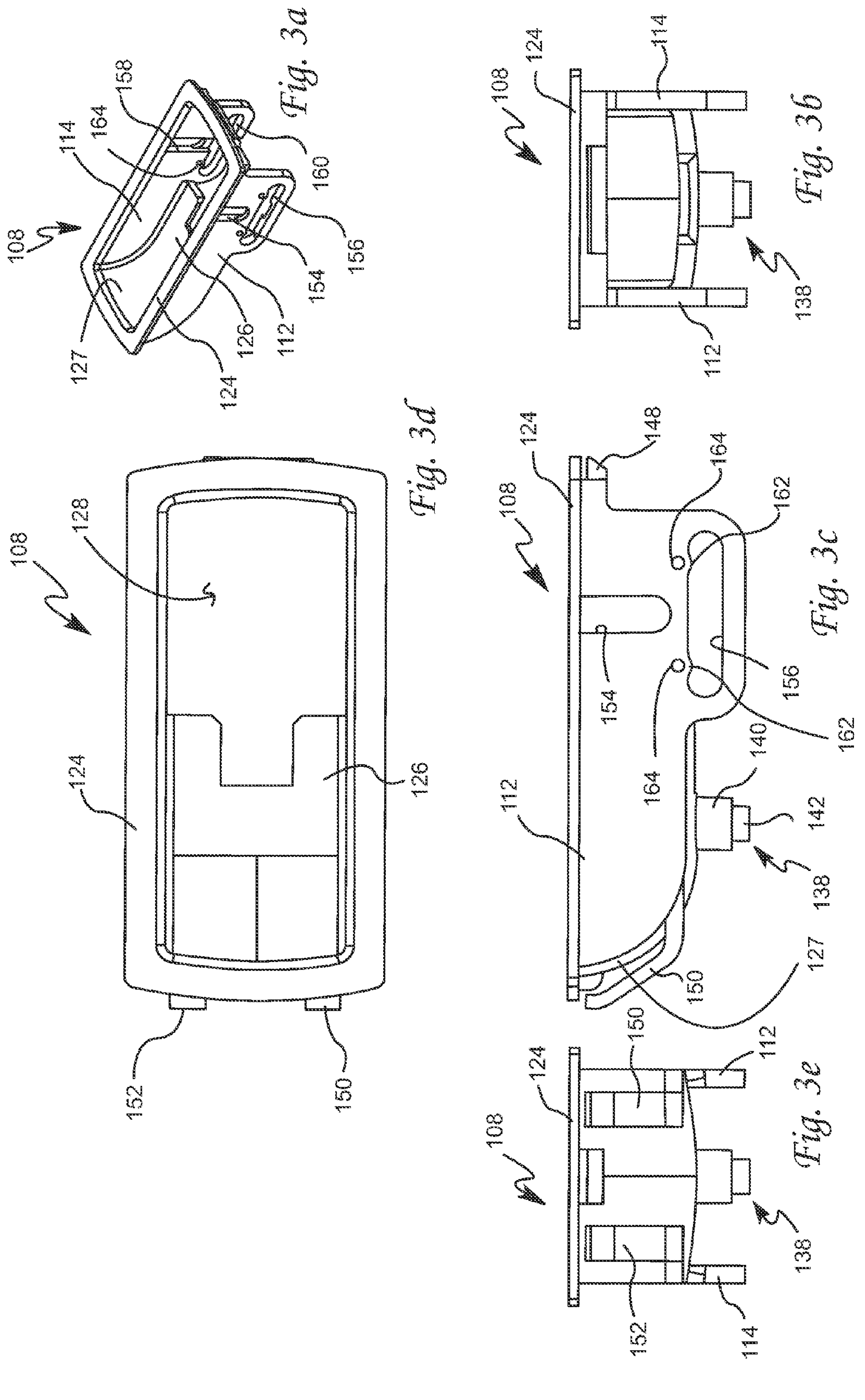
FIGS. 3*a*–3*e* are views of the cup of the sliding panel latch of the present invention.
Figures 4A, 4B, 4C, 4D, 4E:
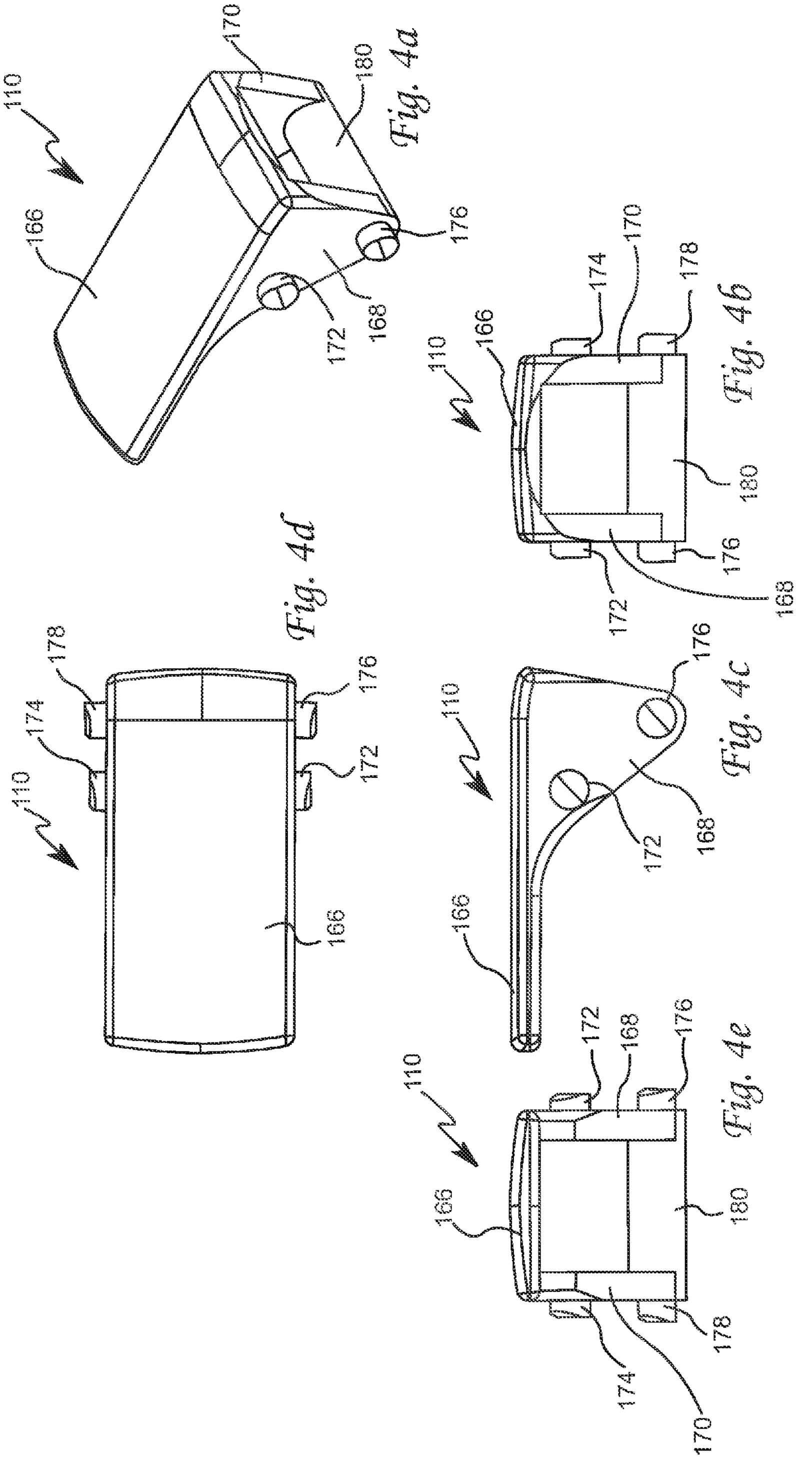
FIGS. 4*a*–4*e* are views of the lever of the sliding panel latch of the present invention.
Figure 5A:
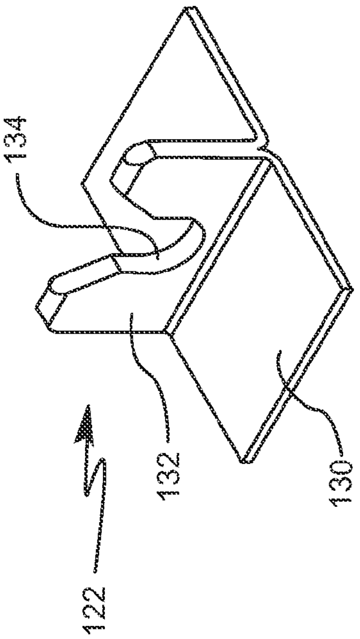
FIGS. 5*a*–5*d* are views of the keeper of the sliding panel latch of the present invention.
Figure 5B:
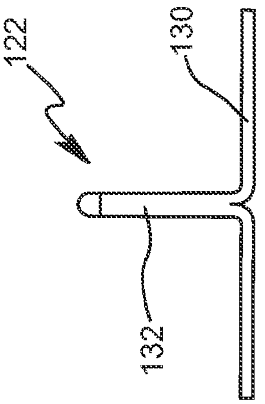
Figure 5C:
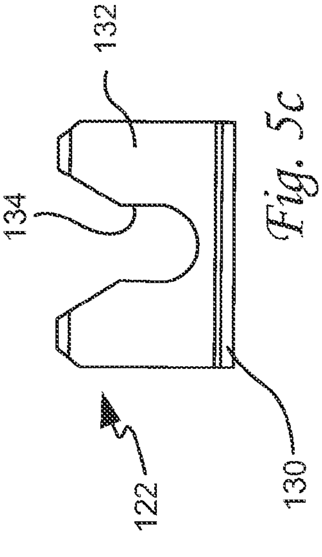
Figure 5D:
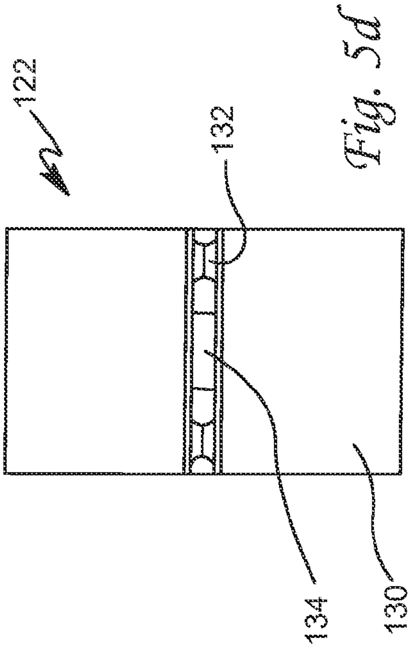
Figures 6A, 6B, 6C, 6D:
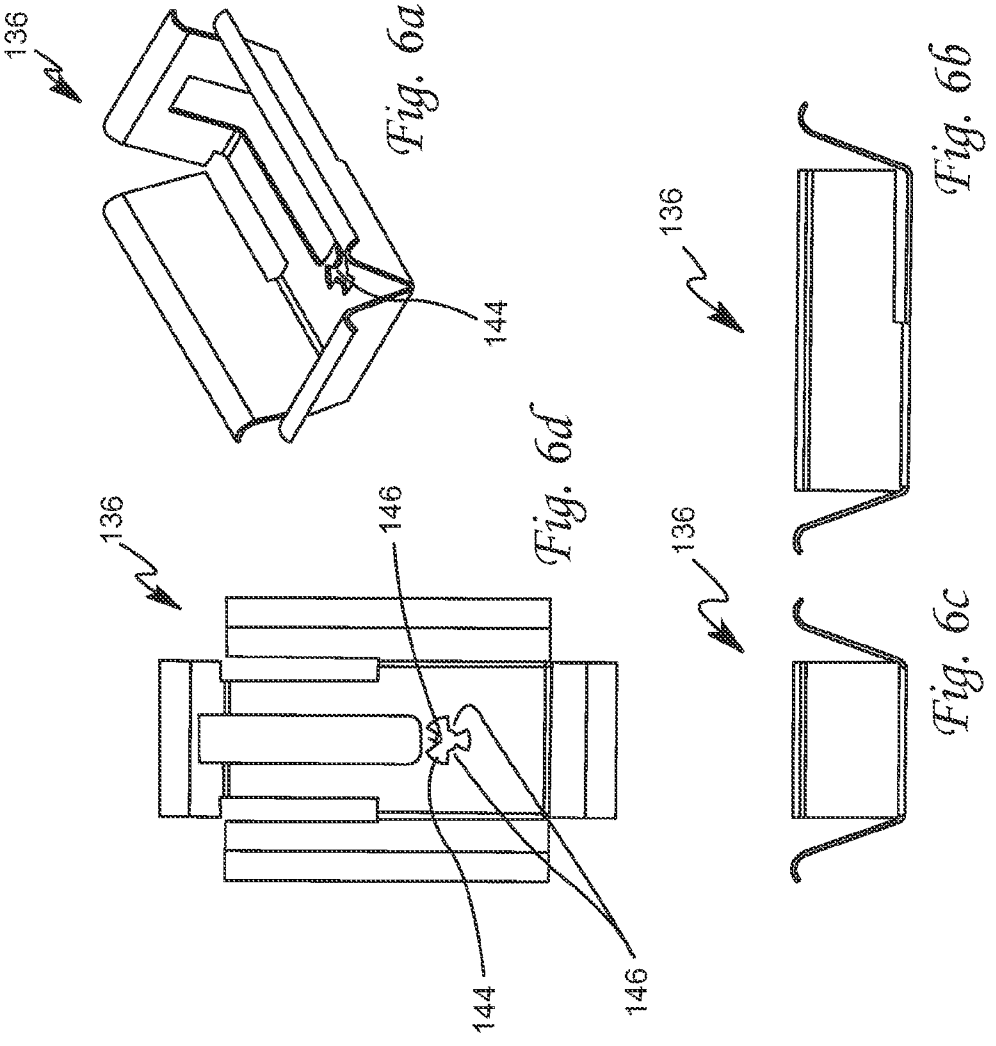
FIGS. 6*a*–6*d* are views of the EMC shield of the sliding panel latch of the present invention.
Figure 7A:
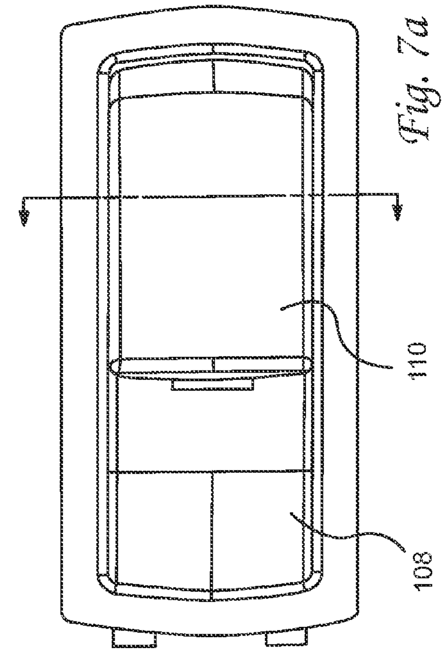
FIGS. 7*a* to 7*c* are views of the sliding panel latch of the present invention in the partially open configuration.
Figure 7B:
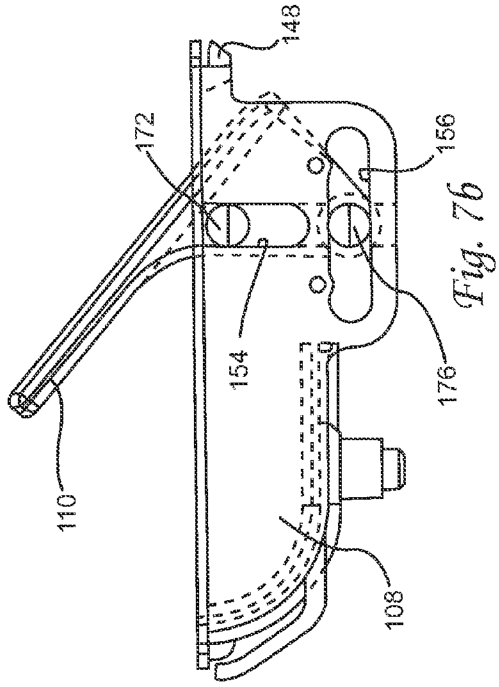
Figure 7C:
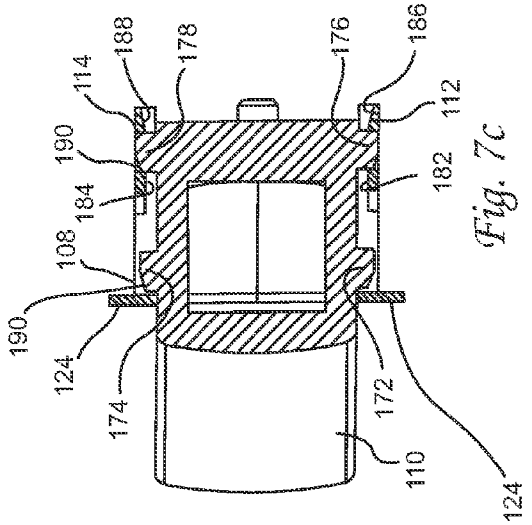

Referring to FIGS. 1*a* to 11*d*, the present invention is directed to a latch that is particularly suited for releasably securing a first member relative to a second member. wherein the first member moves at least in part in a straight linear direction relative to the second member in order to move from the fully open position to the fully closed or secured position. An example of such members is disclosed in U.S. Provisional Patent Application No. 60/371,527, filed Apr. 9, 2002, the entire disclosure of which is incorporated herein by reference. An illustrative embodiment 100 of the latch of the present invent is shown in the drawing figures.

The latch 100 is used for securing a first member, in the illustrated case panel 102, in a closed position relative to a second member, in the illustrated case the container 104. The panel 102 has an opening 106 that permits the installation of the latch 100 to the panel 102. The latch 100 includes a cup 108 adapted for mounting to the first member 102, means for securing the cup 108 to the first member 102, and a lever 110 movably supported by the cup 108.

The cup 108 is adapted for mounting in the opening 106 in the first member 102. The cup 108 is approximately rectangular in plan view. The cup 108 has a flange 124 that is engageable with a portion of the first member 102 adjacent the opening 106. A pair of parallel, long side walls 112 and 114 extend from the flange 124. A short side wall 127 spans the gap between the long side walls 112 and 114 at the front of the cup 108. A bottom wall 126 spans the gap between the long side walls 112 and 114 over a portion of the length of the long side walls 112 and 114 near the bottom edge of the long side walls 112 and 114 such that one side of the bottom of the cup 108 is open. In the illustrated embodiment, the rear of the cup 108 is open beginning a relatively short distance below the flange 124. The large opening 128 formed by this arrangement allows for the engagement of the lever 110 with the keeper 122 to over the entire range of linear movement of the first member 102 from the open position of the first member 102 shown in FIGS. 8*b* and 11*c* to the secured or closed position of the first member 102 shown in FIGS. 10*b* and 11*a*.

The means for securing the cup 108 to the first member 102 includes a tab 148 provided at the rear of the cup 108 below the flange 124. The tab 148 is spaced apart from the flange 124 a distance roughly equal to the thickness of the first member 102 near the rear of the opening 106. The means for securing the cup 108 to the first member 102 also includes a pair of resilient snap legs 150 and 152 that are attached to the short side wall 127 near the bottom thereof. The snap legs 150 and 152 curve upward toward the flange

124, roughly paralleling the short side wall 127 while being spaced apart from the short side wall 127 over a portion of their length. To install the cup 108 to the first member 102, the rear end of the cup 108 is brought into contact with the rear of the opening 106 such that the portion of the first member 102 defining the rear edge of the opening 106 is positioned to be received intermediate the tab 148 and the flange 124. The cup 108 is then pressed into the opening 106 until the flange 124 is lying flat against the exterior surface of the first member 102. During this step of pressing the cup 108 into the opening 106, the resilient snap legs 150 and 152 initially flex toward the short side wall 127 to allow movement of the cup 108 to its mounted position where the flange 124 is lying flat against the exterior surface of the first member 102. Once the cup 108 is in its mounted position, the resilient snap legs 150 and 152 snap back to their original positions relative to the cup 108 such that they are then positioned under the portion of the first member 102 defining the front edge of the opening 106 to thereby secure the cup 108 in the mounted position. Therefore, the cup 108 is secured in the mounted position by the portion of the first member 102 defining the rear edge of the opening 106 being captured intermediate the tab 148 and the flange 124 and by the portion of the first member 102 defining the front edge of the opening 106 being captured intermediate the snap legs 150 and 152 and the flange 124.

The long sidewalls 112 and 114 of the cup 108 are provided with substantially straight elongated slots 154, 156, 158 and 160. The slots 154, 156, 158 and 160 are provided on either side of the cup 108 in a position corresponding to the open bottom portion of the cup 108. The slots 154 and 156 are formed in the side wall 112 and the slots 158 and 160 are formed in the side wall 114. The first pair of slots 154 and 158 are in registry with one another, while the second pair of slots 156 and 160 are in registry with one another. The slots 154 and 158 extend vertically below the flange 124. The slots 156 and 160 are positioned below the slots 154 and 158, respectively. The slots 156 and 160 extend horizontally. Thus, the second pair of slots 156 and 160 extend in a substantially straight linear direction that is perpendicular to the longitudinal direction of the first pair of slots 154 and 158 and vice versa. The second pair of slots 156 and 160 extend in a substantially straight linear direction that is parallel to the plane defined by the bottom surface of the flange 124 that lies flat against the exterior surface of the first member 102.

Near each end of each of the slots 156 and 160 is a projection 162 that extends a short distance from one side of the slot toward the central longitudinal axis of the slot. A hole 164 is formed through the side wall near each projection 162. The perimeter of each hole 164 is roughly parallel to the surface of the respective projection 162 that projects farthest into the slot 156 or 160, and the perimeter of each hole 164 is spaced a small distance apart from the surface of the respective projection 162 that projects farthest into the slot 156 or 160. The holes 164 give added flexibility and resilience to the projections 162. The projections 162 provide detents that frictionally hold the lever 110 in either the closed or the open position until the lever 110 is moved by a user to the desired position.

The lever 110 includes a grasping portion 166 in the form of an approximately rectangular and substantially flat plate that fits within the open top of the cup 108. The grasping portion 166 is shorter than the longitudinal dimension of the open top of the cup 108 such that a user can insert a finger under the grasping portion 166 when the grasping portion 166 is flush with the flange 124 to lift up the grasping portion of the lever 110 and thereby move the lever 110 from the closed position to the open position.

A pair of side plates 168 and 170 extend in parallel from either side of the grasping portion 166 of the lever 110 nearer the rear of the grasping portion 166. A first pair of stub shafts 172 and 174 extend in opposite directions along the same axis from the side plates 168 and 170, respectively. A second pair of stub shafts 176 and 178 extend in opposite directions along the same axis from the side plates 168 and 170, respectively. The stub shafts 172 and 174 are spaced apart from the stub shafts 176 and 178. The stub shafts 172 and 174 are cylindrical and are received in the slots 154 and 158, respectively. The stub shafts 176 and 178 are cylindrical and are received in the slots 156 and 160, respectively. A crossbar 180 extends between the side plates 168 and 170 along the axis defined by the stub shafts 176 and 178. The engagement between the stub shafts 172 and 174 and the slots 154 and 158 allows the lever 110 to pivot about the axis defined by the stub shafts 172 and 174, while allowing the axis defined by the stub shafts 172 and 174 to move in a substantially straight linear direction along the slots 154 and 158. Similarly, the engagement between the stub shafts 176 and 178 and the slots 156 and 160 allows the lever 110 to pivot about the axis defined by the stub shafts 176 and 178, while allowing the axis defined by the stub shafts 176 and 178 to move in a substantially straight linear direction along the slots 156 and 160. The direction of the motion of the axis defined by the stub shafts 176 and 178 will be perpendicular to the direction of motion of the axis defined by the stub shafts 172 and 174 as the lever 110 moves between open and closed positions because of the orientation of the slots 154 and 158 relative to the slots 156 and 160.

Figure 9A:
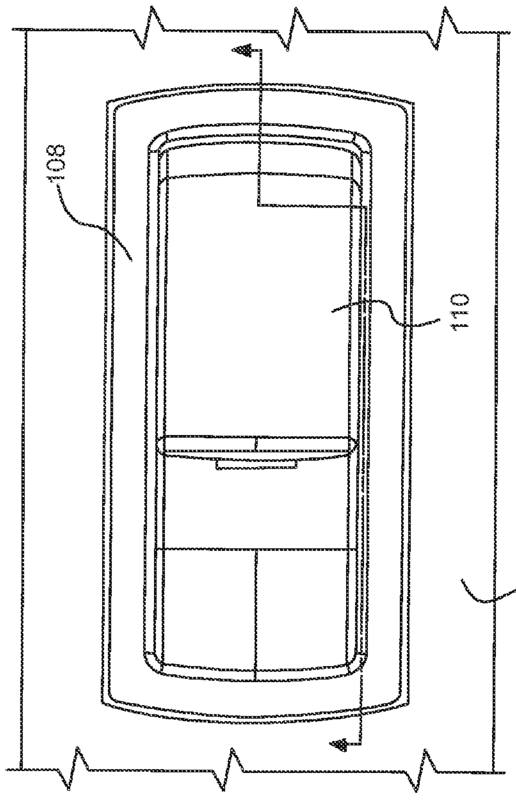
FIGS. 9*a* to 9*b* are views of the sliding panel latch of the present invention in the partially open configuration and showing a longitudinal cross section.
Figure 9B:
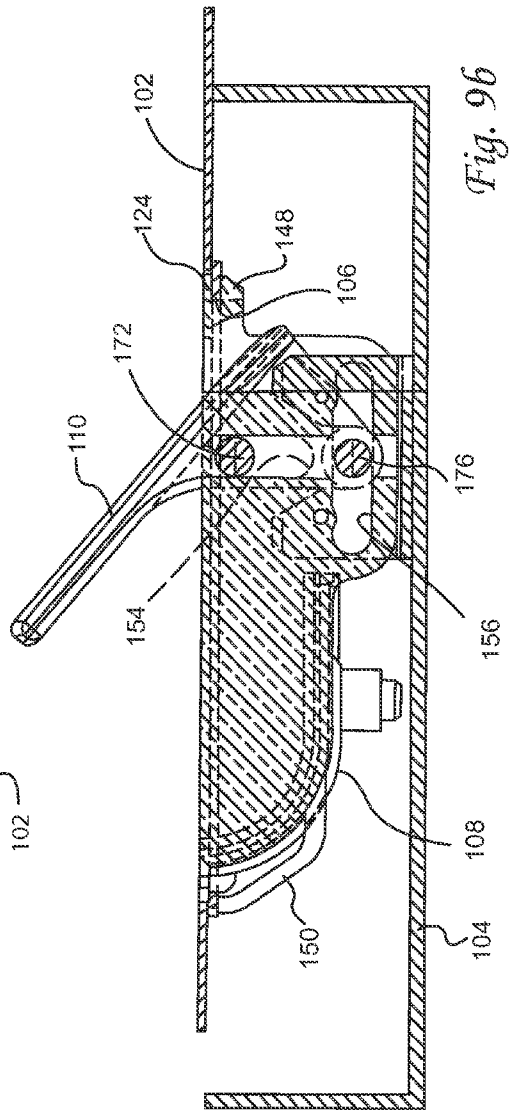
Figure 10A:
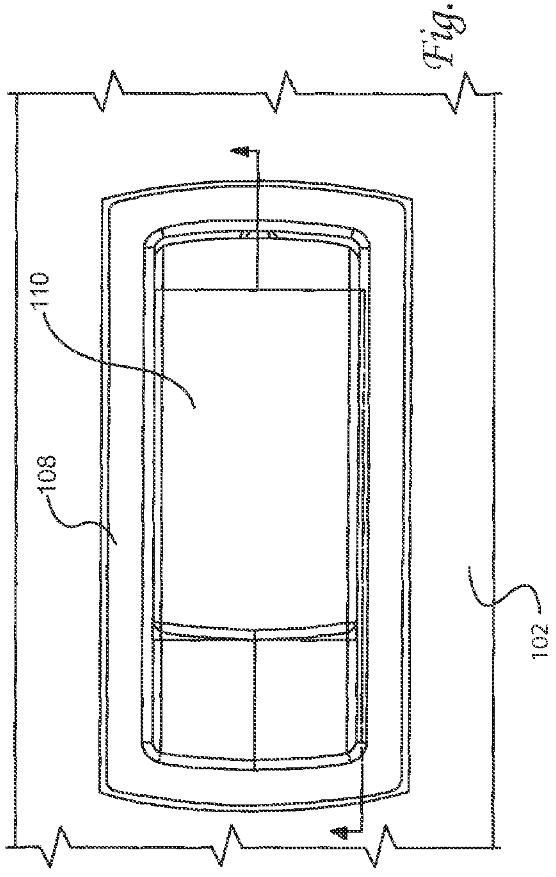
FIGS. 10*a* to 10*b* are views of the sliding panel latch of the present invention in the fully closed configuration.
Figure 10B:
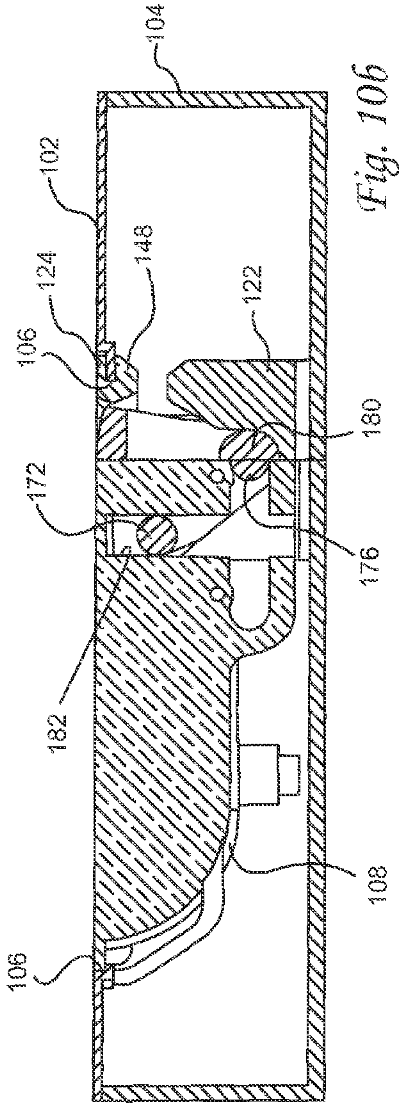
Figures 11A, 11B, 11C, 11D:
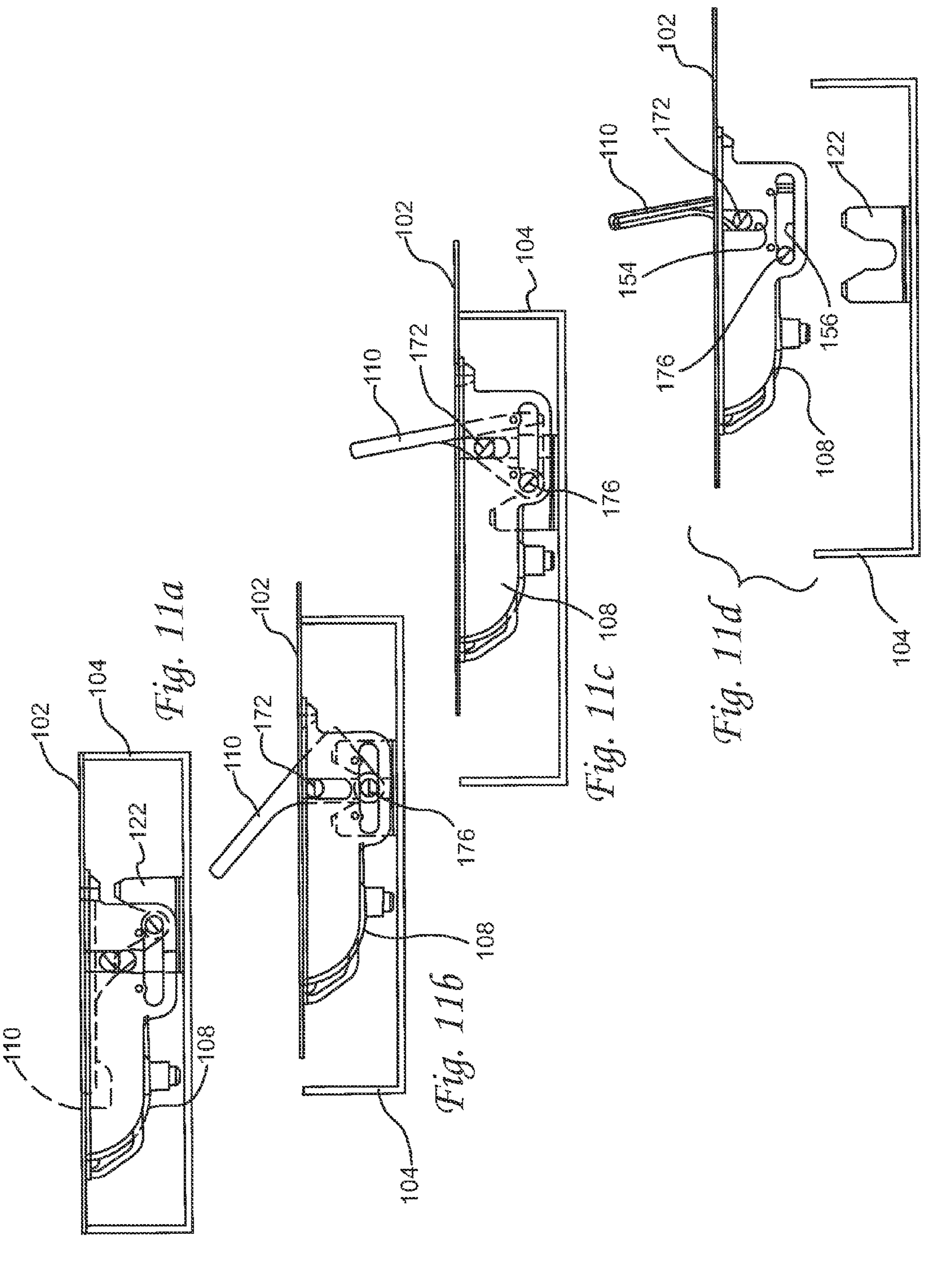
FIGS. 11*a* to 11*d* are views of the sequence of operation of the sliding panel latch of the present invention.

With the stub shafts 172 and 174 engaging the slots 154 and 158 and with the stub shafts 176 and 178 engaging the slots 156 and 160, the stub shafts 172 and 174 will be located near the ends of the slots 154 and 158 that are farthest from the flange 124 and the stub shafts 176 and 178 will be positioned near the ends of the slots 156 and 160 closest to the rear of the cup 108, when the lever 110 is in the closed position illustrated in FIGS. 10*b* and 11*a*. As the lever 110 is lifted up from the closed position toward the partially open position illustrated in FIGS. 9*b* and 11*b*, the stub shafts 172 and 174 move in a substantially straight linear direction toward the flange 124, and the stub shafts 176 and 178 move in a substantially straight linear direction toward the front of the cup 108. As the lever 110 is further moved from the partially open position toward fully open position illustrated in FIGS. 8*b* and 11*c*, the stub shafts 172 and 174 move in a substantially straight linear direction away from the flange 124, and the stub shafts 176 and 178 continue to move in a substantially straight linear direction toward the front of the cup 108. Thus as the lever 110 is moved from the closed position to the open position, the stub shafts 176 and 178 and the coaxial crossbar 180 move in a substantially straight linear direction from their positions closest the rear of the cup 108 to their positions closest to the front of the cup 108.

As the lever 110 is moved from the open position toward the partially open position illustrated in FIGS. 9*b* and 11*b*, the stub shafts 172 and 174 move in a substantially straight linear direction toward the flange 124, and the stub shafts 176 and 178 move in a substantially straight linear direction toward the rear of the cup 108. As the lever 110 is further moved from the partially open position toward fully closed position illustrated in FIGS. 10*b* and 11*a*, the stub shafts 172 and 174 move in a substantially straight linear direction away from the flange 124, and the stub shafts 176 and 178 continue to move in a substantially straight linear direction toward the rear of the cup 108. Thus as the lever 110 is moved from the open position to the closed position, the stub shafts 176 and 178 and the coaxial crossbar 180 move in a substantially straight linear direction from their positions closest the front of the cup 108 to their positions closest to the rear of the cup 108. Accordingly, the lever 110 is supported by the cup 108 in such a way that the lever 110 pivots about a pivot axis that is linearly movable relative to the cup 108. Further, the crossbar 180 is confined by the interaction of stub shafts 176 and 178 and the cup 108 to move in a substantially straight linear direction that is perpendicular to the direction of motion relative to the cup 108 of the pivot axis of the lever 110, as defined by stub shafts 172 and 174, as the lever 110 is moved pivotally about its pivot axis.

Figure 8A:
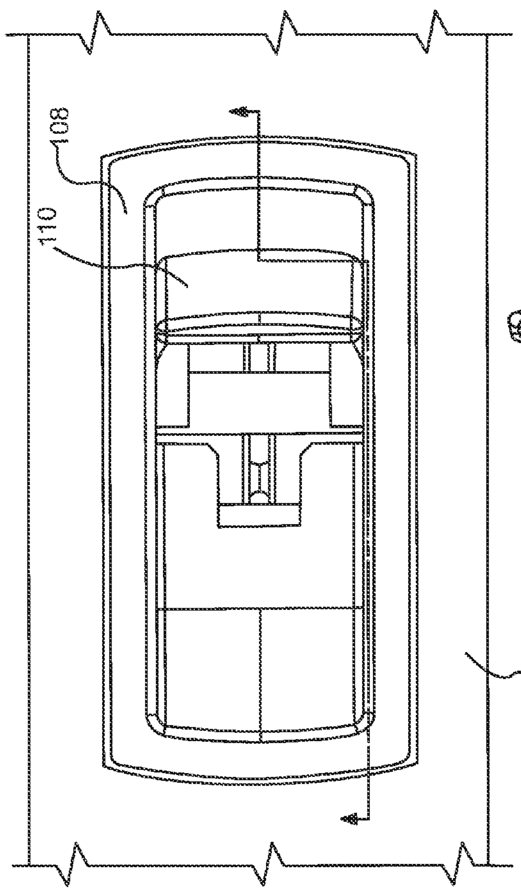
FIGS. 8*a* to 8*b* are views of the sliding panel latch of the present invention in the fully open configuration.
Figure 8B:
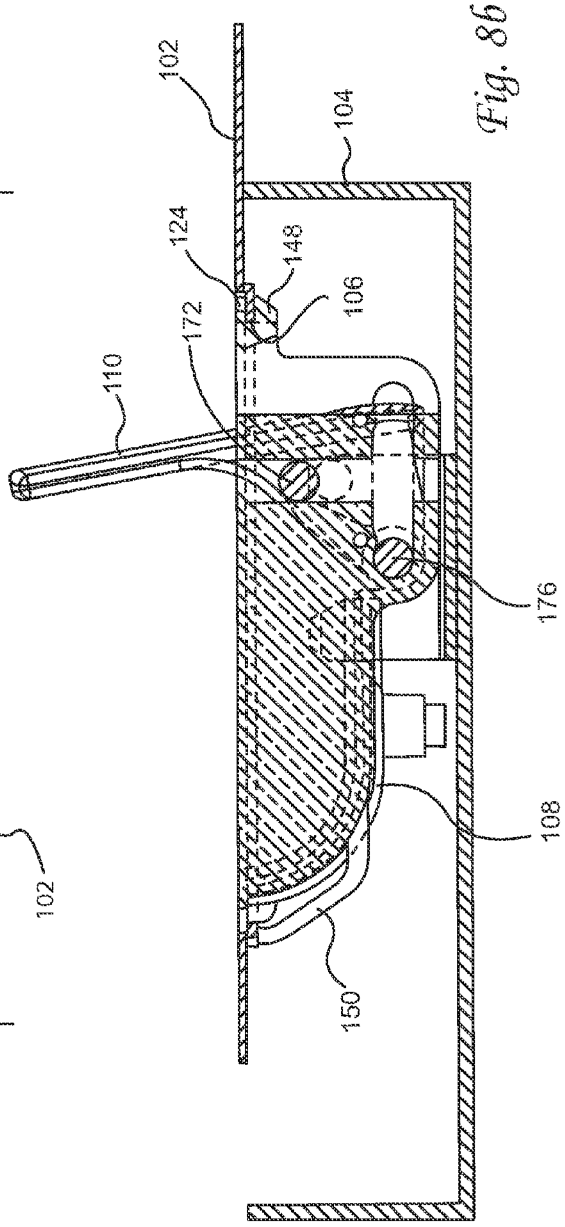

The crossbar 180 is engaged with a keeper 122 that is in a fixed or stationary relationship with a second member 104 when the lever 110 is in the open position and when the first member 102 is in its open position but ready for movement to its fully closed position by a substantially straight linear movement as illustrated in FIGS. 8*b* and 11*c*. Movement of the lever 110 to the closed position causes substantially straight linear movement of the first member 102 from its open position to its fully closed position as illustrated in FIGS. 10*b* and 11*a*, because of the stationary relationship between the keeper 122 and the second member 104. With the crossbar 180 engaged with the keeper 122, the lever 110 in its closed position, and the first member 102 in its closed position, movement of the lever 110 to the open position causes substantially straight linear movement of the first member 102 from its closed position to its open position as illustrated in FIGS. 11*a* to 11*c*. The first member 102 can then be completely removed from the second member 104 as illustrated in FIG. 11*d*.

The keeper 122 has a base portion 130 that can be fixed relative to the second member 104 by, for example, welding. The keeper 122 has a projecting portion 132 that projects from the base portion 130. The geometry and dimensions of the projecting portion 132 can be varied as needed to fit the geometry of the second member 104. The projecting portion 132 is provided with a modified V-notch 134 that has a semicircular or U-shaped bottom adapted to receive the crossbar 180.

In use, the latch 100 is first mounted to the panel 102. With the panel 102 in the position shown in FIG. 11*c*, the panel 102 is positioned over the open top of the container 104. In this position the crossbar 180 engages the keeper notch 134 and cannot move relative to the container 104. As the user forces the lever 110 to the closed position, the panel 102 is forced from the position illustrated in FIG. 11*c* to that illustrated in FIG. 11*a*. In the position illustrated in FIG. 11*a*, the panel 102 is secured in the closed position, for example, by having an edge of the panel 102 move under overhang (not shown) of the container 104. The panel 102 is removed by reversing this sequence.

An optional EMC shield 136 can be provided for shielding out stray electromagnetic fields or radiation that may otherwise enter through the opening 128 when the latch is applied to enclosures for sensitive electronic equipment. The shield 136 is attached to the cup 108 after installation by using the post 138 provided at the bottom of the cup 108. The post 138 has a large diameter portion 140 and a small diameter portion 142. The shield 136 has a corresponding opening 144 having resilient fingers 146 that project into the opening 144. The shield 136 is attached to the cup 108 by pressing the small diameter portion 140 into the opening 144 where the resilient fingers 146 frictionally engage the small diameter portion 142 to secure the shield 136 to the cup 108.

The long side walls 112 and 114 are also provided with assembly slots 182 and 184. The assembly slots 182 and 184 extend about half way into the thickness of the long side walls 112 and 114, respectively. The assembly slots 182 and 184 extend from the flange 124 to the bottom edges of the long side walls 112 and 114, respectively, where each assembly slot widens outward to form beveled surfaces or assembly chambers 186 and 188. The slots 154 and 158 overlap the assembly slots 182 and 184, respectively, over the entire length of the slots 154 and 158. Each of the stub shafts 172, 174, 176, and 178 is also provided with an assembly chamber or bevel 190. To assemble the lever 110 to the cup 108, the lever 110 is inserted through the opening 128 with stub shafts 172 and 176 aligned with assembly slot 182 and with stub shafts 174 and 178 aligned with assembly slot 184. As the lever 110 is pressed into its assembled position the chambers 186, 188, and 190 cooperate to allow the stub shafts 172 and 176 to snap into slots 154 and 156, respectively, and the stub shafts 174 and 178 to snap into slots 158 and 160, respectively. The cup 108 and lever 110 are preferably made of resilient material that allows this type of assembly. An example of such material is plastic.

It is to be understood that the present invention is not limited to the embodiments described above, but encompasses any and all embodiments within the scope of the following claims.

I claim:

1. A latch for securing a first member in a closed position relative to a second member, and there being a keeper that is stationary relative to the second member, the first member having an opening for mounting the latch thereto, the latch comprising:

a cup adapted for mounting in the opening in the first member, said cup having a flange engageable with a portion of the first member adjacent the opening in the first member, said cup having a first pair of slots and a second pair of slots, said second pair of slots extending longitudinally in a direction parallel to a bottom surface of said flange, said first pair of slots extending longitudinally in a direction perpendicular to said direction in which said second pair of slots extend;

means for securing said cup to the first member; and a lever supported by said cup in such a way that said lever can pivot about a pivot axis that is movable along a substantially straight linear direction relative to said cup, said lever being movable between an open position and a closed position relative to said cup, said lever including a crossbar that is adapted to be engageable with the keeper, said lever having a pair of stub shafts positioned in said first pair of slots and said lever having a pair of stub shafts positioned in said second pair of slots, and said crossbar being coaxial with said pair of stub shafts positioned in said second pair of slots such that said crossbar is confined by said cup to move in a substantially straight linear direction that is perpendicular to said direction of motion of said pivot axis of said lever relative to said cup as said lever is moved pivotally about said pivot axis, whereby the first member moves toward the closed position thereof as said lever is moved from said open position of said lever to said closed position of said lever while said crossbar is in engagement with the stationary keeper.

2. The latch according to claim 1, wherein said cup has an open top and said lever has a grasping portion, and wherein said grasping portion of said lever fits within said open top of said cup.

3. The latch according to claim 1, wherein said cup has an open bottom portion capable of allowing engagement of said crossbar with the keeper.

4. The latch according to claim 1, wherein said means for securing said cup to the first member includes a resilient snap leg.

5. The latch according to claim 2, wherein said cup has an open bottom portion capable of allowing engagement of said crossbar with the keeper.

6. The latch according to claim 5, wherein said means for securing said cup to the first member includes a resilient snap leg.

7. The latch according to claim 1, wherein said lever has a grasping portion to enable a user to move said lever between said open position and said closed position.

* * * * *